United States Patent
Inoue (10) Patent No.: US 10,312,875 B2
(45) Date of Patent: Jun. 4, 2019

(54) SOUND PICKUP DEVICE AND SOUND PICKUP METHOD

(71) Applicant: Yamaha Corporation, Hamamatsu-shi, Shizuoka-Ken (JP)

(72) Inventor: Takayuki Inoue, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 15/880,592

(22) Filed: Jan. 26, 2018

(65) Prior Publication Data
US 2018/0152160 A1 May 31, 2018

Related U.S. Application Data

(63) Continuation of application No. PCT/JP2015/073713, filed on Aug. 24, 2015.

(51) Int. Cl.
| | | |
|---|---|---|
| *H03G 3/30* | (2006.01) |
| *H04R 1/40* | (2006.01) |
| *H04R 3/00* | (2006.01) |
| *H04R 29/00* | (2006.01) |

(52) U.S. Cl.
CPC ........ *H03G 3/3005* (2013.01); *H04R 1/406* (2013.01); *H04R 3/005* (2013.01); *H04R 29/005* (2013.01)

(58) Field of Classification Search
CPC ........ H03G 3/3005; H04M 1/60; H04M 9/08; H04R 1/406; H04R 29/005; H04R 3/00; H04R 3/005
USPC ....... 381/58, 66, 71.1, 71.11, 71.8, 92, 94.1, 381/107, 300, 313
See application file for complete search history.

(56) References Cited

U.S. PATENT DOCUMENTS

| | | | |
|---|---|---|---|
| 2008/0232606 A1* | 9/2008 | Holloway ............ | H04R 29/006 381/71.8 |
| 2011/0069846 A1* | 3/2011 | Cheng ................... | H04R 3/005 381/92 |

(Continued)

FOREIGN PATENT DOCUMENTS

| | | |
|---|---|---|
| JP | 9-140000 A | 5/1997 |
| JP | 2004-129038 A | 4/2004 |

(Continued)

OTHER PUBLICATIONS

International Search Report (PCT/ISA/210) issued in PCT Application No. PCT/JP2015/073713 dated Nov. 10, 2015 with English translation (4 pages).

(Continued)

*Primary Examiner* — Vivian C Chin
*Assistant Examiner* — Friedrich Fahnert
(74) *Attorney, Agent, or Firm* — Crowell & Moring LLP (57) ABSTRACT

A sound pickup device includes a plurality of microphones, and at least one processor configured to implement stored instructions and execute a plurality of tasks, including: a first gain controlling task controlling a gain of each of the plurality of microphones, an adding task adding a sound signal to be output from the first gain controlling task with a predetermined gain, a second gain controlling task controlling a gain of the sound signal to be output from the adding task; and a gain setting task setting each gain of the first gain controlling task based on gain setting in the second gain controlling task.

20 Claims, 7 Drawing Sheets

(56) References Cited

U.S. PATENT DOCUMENTS

| | | | | |
|---|---|---|---|---|
| 2011/0085686 A1* | 4/2011 | Bhandari | ............... | H04R 3/005 |
| | | | | 381/313 |
| 2011/0313763 A1* | 12/2011 | Amada | ................. | H04R 3/005 |
| | | | | 704/233 |
| 2014/0098972 A1* | 4/2014 | Yamada | ............... | H04R 29/006 |
| | | | | 381/92 |
| 2014/0133666 A1 | 5/2014 | Tanaka et al. | | |
| 2014/0146972 A1* | 5/2014 | Sun | ...................... | H04R 29/006 |
| | | | | 381/58 |
| 2015/0127351 A1* | 5/2015 | Buck | ....................... | G10L 21/02 |
| | | | | 704/270 |
| 2018/0262832 A1* | 9/2018 | Grosche | ................. | H04R 3/005 |

FOREIGN PATENT DOCUMENTS

| | | |
|---|---|---|
| JP | 2005-57450 A | 3/2005 |
| JP | 2011-119783 A | 6/2011 |
| JP | 2014-116930 A | 6/2014 |
| JP | 2014-116932 A | 6/2014 |

OTHER PUBLICATIONS

Japanese-language Written Opinion (PCT/ISA/237) issued in PCT Application No. PCT/JP2015/073713 dated Nov. 10, 2015 (3 pages).
Extended European Search Report issued in counterpart European Application No. 15902230.0 dated Jan. 21, 2019 (six (6) pages).
Chandra S. P. et al., "Audio Mixer for Multi-party Conferencing in VoIP", Internet Multimedia Services Architecture and Applications, Dec. 9, 2009, Piscataway, NJ, XP031653524, (six (6) pages).

* cited by examiner

SOUND PICKUP DEVICE AND SOUND PICKUP METHOD

CROSS REFERENCE TO RELATED APPLICATIONS

The present application is a continuation of International Application No. PCT/JP2015/073713, filed on Aug. 24, 2015, the entire content of which is incorporated herein by reference.

BACKGROUND OF THE INVENTION

1. Field of the Invention

The present invention relates to a sound pickup device and a sound pickup method that control a gain of a plurality of microphones.

2. Description of the Related Art

Conventionally, a sound pickup system including a plurality of extension units and a host unit has been proposed (see Japanese Unexamined Patent Application Publication No. 2014-116932, for example). In the sound pickup system of Japanese Unexamined Patent Application Publication No. 2014-116932, each of the extension units is provided with a microphone. The host unit compares the levels of sound signals of sound picked up by the microphone of each of the extension units, and selects an extension unit of the maximum level and outputs. Thus, the sound pickup system of Japanese Unexamined Patent Application Publication No. 2014-116932 outputs sound of a speaker selectively.

In the sound pickup system of Japanese Unexamined Patent Application Publication No. 2014-116932, each of the extension units is provided with an AGC (an automatic gain control amplifier). The AGC decreases a gain in a case in which sound exceeding a predetermined level is input and increases a gain in a case in which sound of less than the predetermined level is input. As a result, the sound pickup system of Japanese Unexamined Patent Application Publication No. 2014-116932 is able to pick up voice of a speaker at some consistent level.

However, the sound pickup system of Japanese Unexamined Patent Application Publication No. 2014-116932 may generate a volume difference when selection of the extension unit is switched since a gain for each microphone may be different. For example, in a state in which a first microphone having a small gain is selected, if an unexpected noise is input to a second microphone having a large gain, the sound pickup system performs processing to switch to the second microphone having a large gain. At this time, since the microphone having a small gain is switched to the microphone having a large gain, volume may become large suddenly.

SUMMARY OF THE INVENTION

Therefore, an object of the present invention is to provide a sound pickup device and a sound pickup method that are able to reduce a volume difference when selection of a microphone is switched.

A sound pickup device includes a plurality of microphones, and at least one processor configured to implement stored instructions and execute a plurality of tasks, including: a first gain controlling task controlling a gain of each of the plurality of microphones; an adding task adding a sound signal to be output from the first gain controlling task with a predetermined gain, a second gain controlling task controlling a gain of the sound signal to be output from the adding task, and a gain setting task setting each gain of the first gain controlling task based on gain setting in the second gain controlling task.

In this manner, the sound pickup device is provided with a first gain controlling task (a first gain controller (a first AGC)) for each microphone. Each first AGC decreases a gain in a case in which sound exceeding a predetermined level is input and increases a gain in a case in which sound of less than the predetermined level is input.

Then, the sound pickup device adds a sound signal of which the gain has been adjusted by each AGC, and also controls the gain in the second gain controlling task (the second gain controller (a second AGC)). A gain setting value in the second AGC is set to the first AGC. Thus, the same gain setting value is reflected in all the microphones.

Therefore, even when a loud noise is unexpectedly input to a certain microphone, for example, and selection is switched to the microphone, a gain setting value does not change largely, so that volume does not become large suddenly. In addition, since the gain of a microphone that is not selected is not decreased, even when selection is switched to a microphone having a small gain, sound at the beginning of talk does not become difficult to be heard.

According to the present invention, a volume difference is able to be reduced when selection of a microphone is switched.

The above and other elements, features, characteristics, and advantages of the present invention will become more apparent from the following detailed description of the preferred embodiments with reference to the attached drawings.

DETAILED DESCRIPTION OF THE PREFERRED EMBODIMENTS

Figure 1:
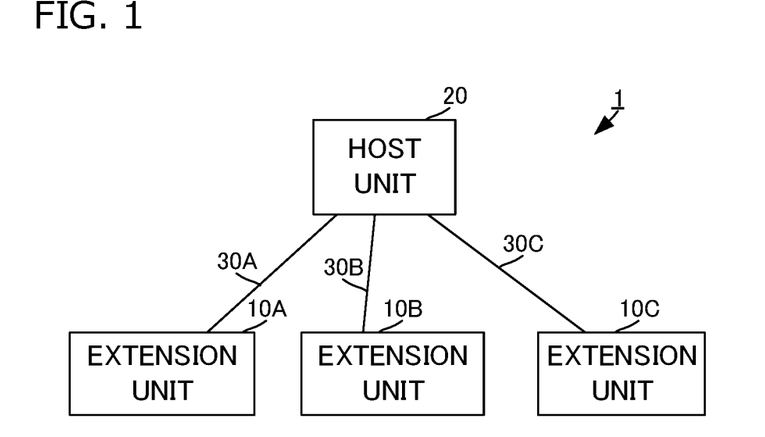
FIG. 1 is a block diagram illustrating a configuration of a sound pickup device.

FIG. 1 is a configuration view of a sound pickup device 1 according to a preferred embodiment of the present invention. The sound pickup device 1 is provided with an extension unit 10A, an extension unit 10B, an extension unit 10C, and a host unit 20. In this example, while the number of extension units is three, the number of extension units may be two or four or more.

Each of the extension unit 10A, the extension unit 10B, and the extension unit 10C is connected to the host unit 20, respectively, through an analog audio line 30A, an analog audio line 30B, and an analog audio line 30C.

Figure 2:
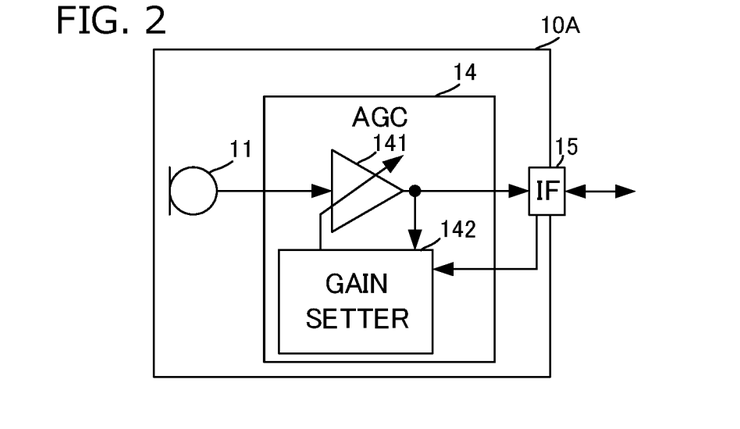
FIG. 2 is a block diagram illustrating a configuration of an extension unit.
Figure 3:
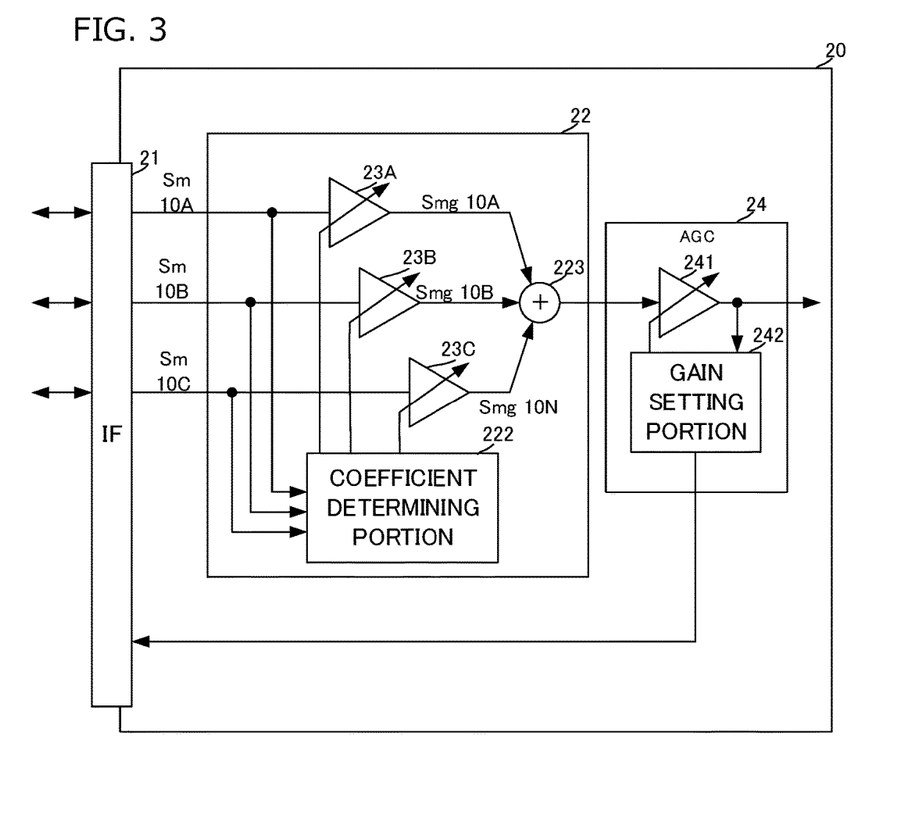
FIG. 3 is a block diagram illustrating a configuration of a host unit.

FIG. 2 is a block diagram illustrating a configuration of the extension unit 10A, and FIG. 3 is a block diagram illustrating a configuration of the host unit 20. It is to be noted that, since the extension unit 10A, the extension unit 10B, and the extension unit 10C have the same configuration and the same function, the extension unit 10A is illustrated in FIG. 2 as a representative.

The extension unit 10A is provided with a microphone 11, an AGC (a first gain controlling task (a first gain controller)) 14, and an interface (IF) 15. The microphone 11 picks up sound generated around the extension unit 10A. A sound signal related to a picked-up sound is input to the AGC 14. While the present preferred embodiment illustrates an example in which the number of microphones is one, the extension unit 10A may be provided with a plurality of microphones.

The AGC 14 is provided with a gain adjusting portion 141 and a gain setting portion (a gain setting task (a gain setter)) 142. The gain adjusting portion 141 inputs a sound signal that has been output from the microphone 11.

The gain adjusting portion 141 adjusts the level of an input sound signal, and outputs the signal to the IF 15 provided in a subsequent stage. The gain of the gain adjusting portion 141 is set to the gain setting portion 142.

The gain setting portion 142, based on the level of the sound signal that has been output from the gain adjusting portion 141, sets the gain of the gain adjusting portion 141. Specifically, the gain setting portion 142 calculates the level of an output sound signal. The level of the sound signal is obtained by averaging the peak values of amplitude for a predetermined time, for example. Then, the gain setting portion 142, when a calculated level is greater than the maximum threshold value, sets the gain of the gain adjusting portion 141 to be small. As a result, the gain setting portion 142 keeps the level of the sound signal to be output from the gain adjusting portion 141 to the maximum threshold value or below. In addition, the gain setting portion 142, when the level of the output sound signal is less than the minimum threshold value, sets the gain of the gain adjusting portion 141 to be large. As a result, the gain setting portion 142 keeps the level of the sound signal to be output from the gain adjusting portion 141 to the minimum threshold value or above.

In this manner, the sound signal of which the gain has been adjusted by the AGC 14 is output to the IF 15. The IF 15 is an analog audio terminal. The IF 15 outputs the sound signal that has been input from the AGC 14 to the host unit 20.

The host unit 20 is provided with an IF 21, an adding portion (an adding task (an adder)) 22, and an AGC (a second gain controlling task (a second gain controller)) 24. The IF 21 is an analog audio terminal. The IF 21 inputs the sound signals that have been output from each extension unit. The IF 21 inputs each of the sound signals that have been input from each extension unit, to the adding portion 22.

The adding portion 22 is provided with an amplifier 23A, an amplifier 23B, an amplifier 23C, a coefficient determining portion 222, and an adder 223.

A sound signal that has been input from the extension unit 10A is input to the amplifier 23A. A sound signal that has been input from the extension unit 10B is input to the amplifier 23B. A sound signal that has been input from the extension unit 10C is input to the amplifier 23C.

In addition, the sound signals that have been input from each extension unit are input to the coefficient determining portion 222. The coefficient determining portion 222 compares the levels of the sound signals that have been input from each extension unit. For example, the coefficient determining portion 222, among the levels of the sound signals that have been input from each extension unit, sets the gain of the amplifier corresponding to the sound signal determined as the maximal level to a maximum value (gain =1), and sets the gain of the amplifier corresponding to other sound signals to a minimum value (gain=0).

In this manner, the coefficient determining portion 222 sets the gain to "1" or "0" and selects only the extension unit that has output the sound signal of the highest level, so that other extension units are not to be selected (the sound signals of the sound picked up by the other extension units are not to be output to a subsequent stage). However, the coefficient determining portion 222 may set a gain by weighting according to the level of each sound signal, for example, may mix all the sound signals, and may output the signals to the subsequent stage.

The sound signal that has been output from each amplifier is added by the adder 223, and is output to the AGC 24. The AGC 24 is provided with a gain adjusting portion 241 and a gain setting portion 242. The gain adjusting portion 241 inputs a sound signal that has been output from the adding portion 22.

The gain adjusting portion 241 adjusts the level of the sound signal to be output to the subsequent stage. The gain of the gain adjusting portion 241 is set to the gain setting portion 242.

The gain setting portion 242, based on the level of the sound signal output that has been from the gain adjusting portion 241, sets the gain of the gain adjusting portion 241. Specifically, the gain setting portion 242, when the level of the output sound signal is greater than the maximum threshold value, sets the gain of the gain adjusting portion 241 to be small. As a result, the gain setting portion 242 keeps the level of the sound signal to be output from the gain adjusting portion 241 to the maximum threshold value or below. In addition, the gain setting portion 242, when the level of the output sound signal is less than the minimum threshold value, sets the gain of the gain adjusting portion 241 to be large. As a result, the gain setting portion 242 keeps the level of the sound signal to be output from the gain adjusting portion 241 to the minimum threshold value or above.

Further, the gain setting portion 242 makes notification of the gain that has been set to the gain adjusting portion 241, to the extension unit 10A, the extension unit 10B, and the extension unit 10C. The notification is transmitted by analog modulation (AM modulation, for example) through an analog audio line, for example. The gain setting portion 242 AM-modulates information related to the gain that has been set to the gain adjusting portion, and outputs the information through the IF 21 as a modulation signal.

The gain setting portion 142 of each extension unit demodulates the modulation signal to be input through the IF 15, and extracts the information related to the above gain. Then, the gain setting portion 142, based on the information related to a demodulated gain, sets the gain that has been set to the gain setting portion 242 of the host unit 20, to the gain adjusting portion 141. As a result, the gain setting value in the gain setting portion 242 of the host unit 20 is reflected in all the extension units.

In this manner, since, in the sound pickup device, each extension unit (the extension unit 10A, the extension unit 10B, and the extension unit 10C) is provided with the AGC 14, an appropriate gain according to the volume of each speaker is set. Further, in the sound pickup device, the host unit 20 is also provided with the AGC 24 and the gain setting of the AGC 24 of the host unit 20 is reflected in the AGC of all the extension units. Therefore, even when a loud noise is unexpectedly input to a certain extension unit, for example, and selection is switched to the extension unit, sound is picked up with the same gain as the gain of the extension unit before being switched, so that volume does not change largely. In addition, since the gain of the AGC 14 in an extension unit that is not selected is not decreased, switching to an extension unit having a small gain does not cause sound at the beginning of talk to become difficult to be heard.

It is to be noted that, while the above example illustrates an example in which each extension unit outputs a sound signal as it is to the host unit 20 through the analog audio line, each extension unit modulates a sound signal, for example, by a predetermined modulation method (AM modulation, for example) and then may transmit the sound signal to the host unit 20. In this case, the host unit 20 is provided with a decoder that demodulates an input modulation signal.

Figure 4:
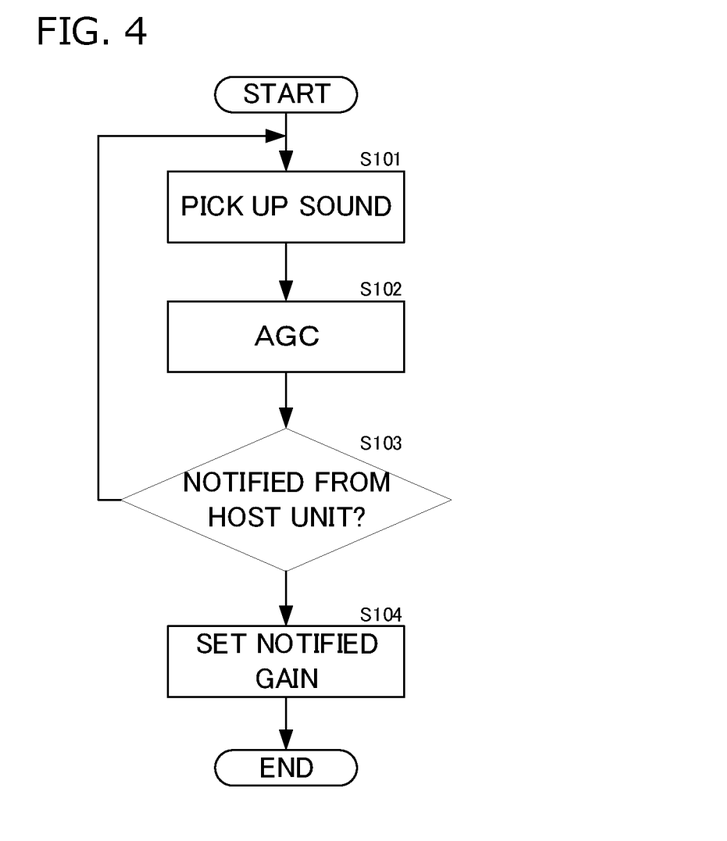
FIG. 4 is a flow chart showing an operation of the extension unit.
Figure 5:
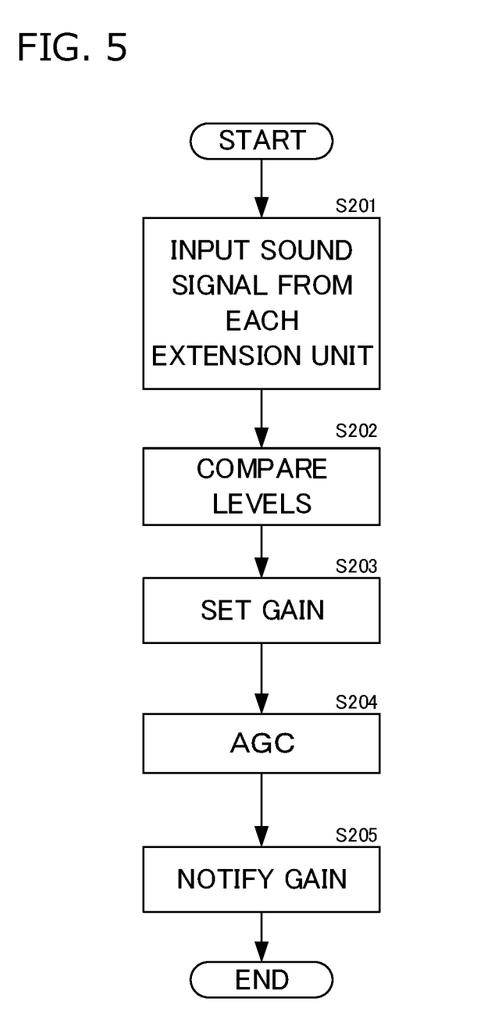
FIG. 5 is a flow chart showing an operation of the host unit.

Subsequently, FIG. 4 is a flow chart showing an operation of the extension unit (the extension unit 10A, the extension unit 10B, and the extension unit 10C), and FIG. 5 is a flow chart showing an operation of the host unit 20.

First, the extension unit 10A, the extension unit 10B, and the extension unit 10C pick up sound with each microphone (S101). Then, the extension unit 10A, the extension unit 10B, and the extension unit 10C each perform gain adjustment by the AGC 14 (the gain adjusting portion 141 and the gain setting portion 142) (S102). Subsequently, the extension unit 10A, the extension unit 10B, and the extension unit 10C each determine whether the notification of gain setting has been made from the host unit 20 (S103). The extension unit 10A, the extension unit 10B, and the extension unit 10C each repeat processing of sound pickup and the AGC until the notification of gain setting is made. Each gain setting portion 142 of the extension unit 10A, the extension unit 10B, and the extension unit 10C sets the gain notified from the host unit 20 to the gain adjusting portion 141 in a case in which the notification of gain setting is made from the host unit 20 (S104).

On the other hand, the host unit 20 inputs sound signals from each extension unit (S201). The coefficient determining portion 222 of the adding portion 22 compares the levels of the sound signals that have been input from each extension unit (S202). The coefficient determining portion 222 sets the gain of the amplifier corresponding to the sound signal determined to be a maximal level to 1, and sets the gain of the amplifier corresponding to other sound signals to 0 (S203).

Then, the gain adjusting portion 241 of the AGC 24 adjusts the level of the sound signal to be output to the subsequent stage (S204). In other words, the gain setting portion 242, based on the level of the sound signal that has been output from the gain adjusting portion 241, sets the gain of the gain adjusting portion 241. At the end, the gain setting portion 242 notifies each extension unit of information related to the gain that has been set to the gain adjusting portion 241 (S205).

It is to be noted that, while the above example illustrates an example in which the information related to gain setting through the analog audio line is notified by analog modulation (AM modulation), the extension unit and the host unit maybe connected through a digital communication line such as a USB, for example. In this case, the information related to gain setting is transmitted and received with a predetermined packet or the like.

Figure 6:
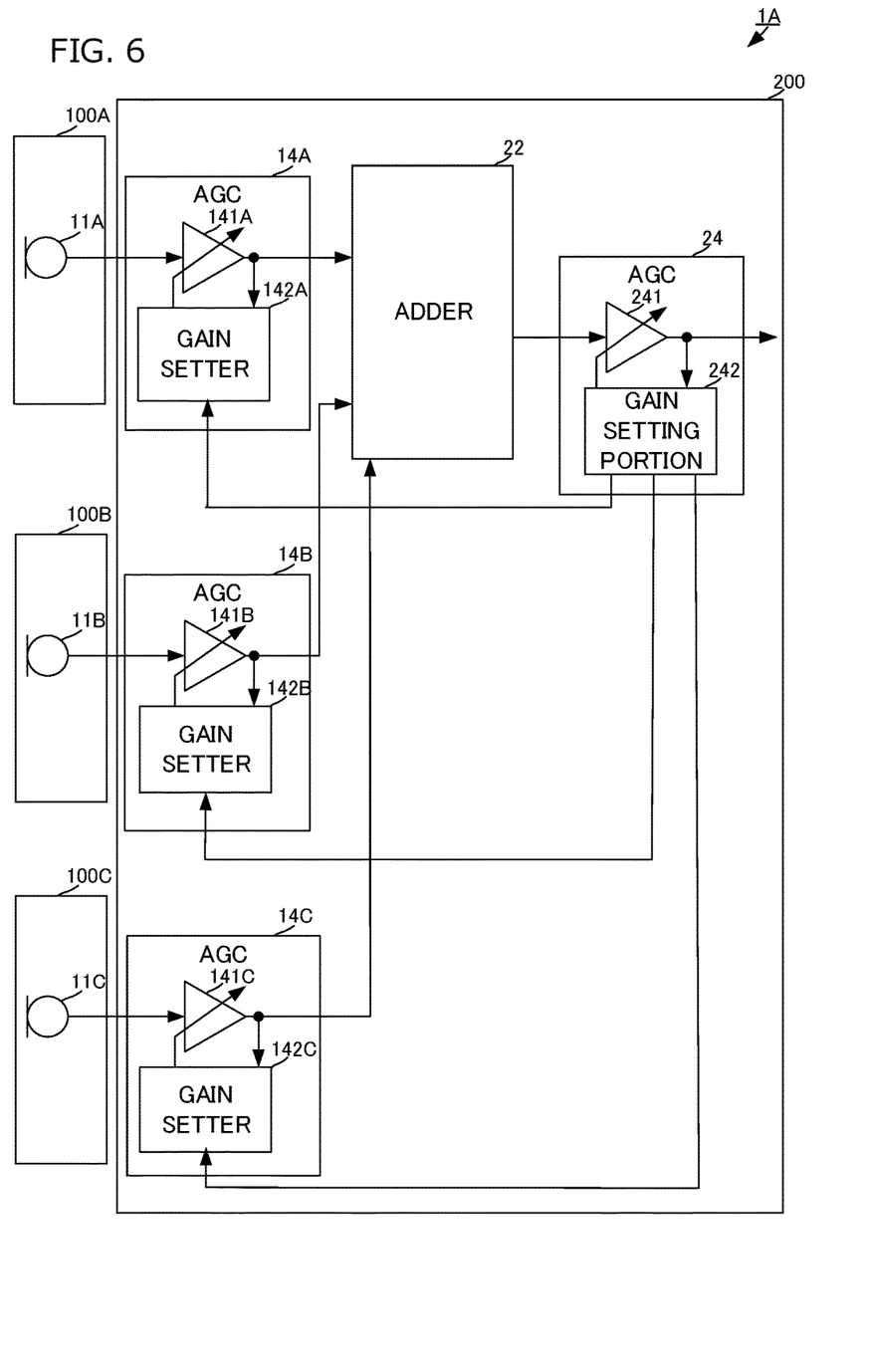
FIG. 6 is a block diagram illustrating a configuration of a sound pickup device according to a first modification.

Subsequently, FIG. 6 is a block diagram illustrating a configuration of a sound pickup device 1A according to a first modification. In the sound pickup device 1, an example in which each microphone and each gain adjusting portion (the first gain controller) are provided in each extension unit being a first housing, and the adding portion 22, the gain adjusting portion 241 (the second gain controller) and the gain setting portion 242 are provided in the host unit 20 being a second housing is illustrated. However, in the sound pickup device 1A, each microphone (a microphone 11A, a microphone 11B, and a microphone 11C) are each provided in each extension unit being a first housing, and a first gain controller (a gain adjusting portion 141A, a gain adjusting portion 141B, and a gain adjusting portion 141C), an adding portion 22, a second gain controller (a gain adjusting portion 241), and a gain setting portion 242 are provided in a host unit 200 being a second housing.

In other words, the sound pickup device 1A according to the first modification is provided with an extension unit 100A, an extension unit 100B, an extension unit 100C, and the host unit 200 as illustrated in FIG. 6. The extension unit 100A includes the microphone 11A, the extension unit 100B includes the microphone 11B, and the extension unit 100C includes the microphone 11C.

The host unit 200 is provided with an AGC 14A to which a sound signal picked up by the microphone 11A is input, an AGC 14B to which a sound signal picked up by the microphone 11B is input, and an AGC 14B to which a sound signal picked up by the microphone 11B is input.

The AGC 14A is provided with a gain adjusting portion 141A and a gain setting portion 142A like the AGC 14 illustrated in FIG. 2. The gain adjusting portion 141A and the gain setting portion 142A have the same function as the gain adjusting portion 141 and the gain setting portion 142. Similarly, the AGC 14B and the AGC 14C are provided with the same configuration and functions as the AGC 14.

In this manner, it is also possible to configure only the configuration of a microphone to be provided in an extension unit. In addition, in this case, the AGC 24 is connected with the AGC 14A, the AGC 14B, and the AGC 14C through an internal bus. Therefore, the gain setting portion 242 of the AGC 24 is able to control each of the gain setting portion 142A, the gain setting portion 142B, and the gain setting portion 142C.

Figure 7:
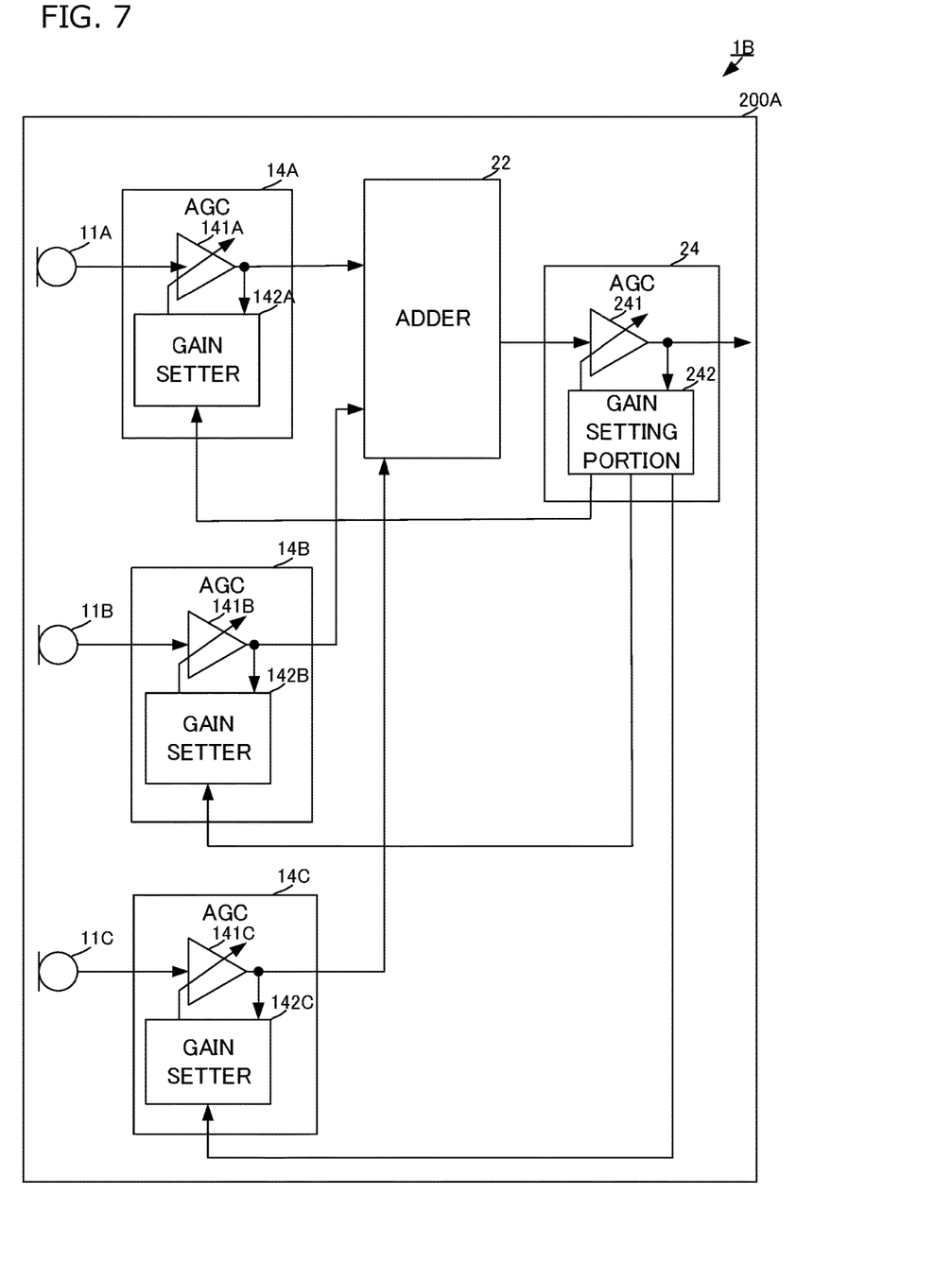
FIG. 7 is a block diagram illustrating a configuration of a sound pickup device according to a second modification.

Moreover, as illustrated in a sound pickup device 1B according to a second modification of FIG. 7, it is also possible to configure all the configurations including a microphone to be provided in a host unit 200A being one housing. In this case, the gain setting portion 242 of the AGC 24 is also able to control each of the gain setting portion 142A, the gain setting portion 142B, and the gain setting portion 142C.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A sound pickup device, comprising:
   a plurality of microphones; and
   at least one processor configured to implement stored instructions and execute a plurality of tasks, including:
      a first gain controlling task controlling a first gain of each of the plurality of microphones;
      an adding task adding a sound signal to be output from the first gain controlling task with a predetermined gain;
      a second gain controlling task controlling a gain of the sound signal to be output from the sound pickup device; and a gain setting task setting each first gain of the first gain controlling task based on gain setting in the second gain controlling task.

2. The sound pickup device according to claim 1, wherein;
the adding task compares levels of sound signals based on each of the plurality of microphones, the sound signals having been output from the first gain controlling task; and
the predetermined gain is set based on a comparing result of the levels.

3. The sound pickup device according to claim 1, comprising:
a plurality of first housings; and
a second housing communicable with each of the plurality of first housings.

4. The sound pickup device according to claim 3, wherein:
each of the plurality of microphones is provided in each of the plurality of first housings; and
the first gain controlling task, the adding task, the second gain controlling task, and the gain setting task are provided in the second housing.

5. The sound pickup device according to claim 3, wherein:
the plurality of tasks includes a plurality of the first gain controlling tasks;
each of the plurality of microphones and each of the plurality of first gain controlling tasks are provided in each of the plurality of first housings; and
the adding task, the second gain controlling task, and the gain setting task are provided in the second housing.

6. A sound pickup device, comprising:
a plurality of microphones;
a first gain controller controlling a first gain of each of the plurality of microphones;
an adder adding a sound signal to be output from the first gain controller with a predetermined gain;
a second gain controller controlling a second gain of the sound signal to be output from the adder; and
a gain setter setting each first gain of the first gain controller based on gain setting in the second gain controller.

7. The sound pickup device according to claim 6, wherein the adder compares levels of sound signals based on each of the plurality of microphones, the sound signals having been output from the first gain controller; and
the predetermined gain is set based on a comparing result of the levels.

8. The sound pickup device according to claim 6, comprising:
a plurality of first housings; and
a second housing communicable with each of the plurality of first housings.

9. The sound pickup device according to claim 8, wherein:
each of the plurality of microphones is provided in each of the plurality of first housings; and
the first gain controller, the adder, the second gain controller, and the gain setter are provided in the second housing.

10. The sound pickup device according to claim 8, comprising a plurality of the first gain controllers, wherein:
each of the plurality of microphones and each of the plurality of first gain controllers are provided in each of the plurality of first housings; and
the adder, the second gain controller, and the gain setter are provided in the second housing.

11. The sound pickup device according to claim 8, wherein the plurality of first housings and the second housing are connected with an analog audio line.

12. The sound pickup device according to claim 11, wherein:
the gain setter transmits gain setting information set to the first gain controller by a modulation signal; and
the first gain controller demodulates the modulating signal and sets a gain of the first gain controller.

13. The sound pickup device according to claim 6, wherein the adder selects a sound signal of a highest level and outputs the sound signal that has been selected.

14. The sound pickup device according to claim 6, comprising a plurality of the first gain controllers, wherein the plurality of the first gain controllers correspond one-to-one to the plurality of microphones.

15. A sound pickup method comprising the steps of:
picking up sound by each of a plurality of microphones;
controlling a first gain of each of the plurality of microphones in a first gain controller;
adding each sound signal that has been controlled in the first gain controller, in an adder, with a predetermined gain;
controlling a second gain of the sound signal that has been added in the adder, in a second gain controller; and
setting gain setting in the first gain controller based on gain setting in the second gain controller, in a gain setter.

16. The sound pickup method according to claim 15, further comprising the steps of:
comparing levels of sound signals based on each of the plurality of microphones, the sound signals having been output from the first gain controller, wherein the predetermined gain is set based on a comparing result of the levels.

17. The sound pickup method according to claim 15, further comprising the steps of:
picking up the sound by the microphone provided in each of a plurality of first housings; and
in a second housing,
controlling a gain of the microphone provided in each of the plurality of first housings, in the first gain controller,
adding each sound signal that has been controlled in the first gain controller, in the adder,
controlling a gain of the sound signal that has been added in the adder, in the second gain controller, and
setting gain setting in the first gain controller based on gain setting in the second gain controller, in the gain setter.

18. The sound pickup method according to claim 15, further comprising the steps of:
in the plurality of first housings,
picking up each sound by the microphone provided in each of a plurality of first housings, and
controlling a gain of the microphone provided in each of the plurality of first housings, in the first gain controller; and
in a second housing,
adding each sound signal that has been controlled in the first gain controller, in the adder,
controlling a gain of the sound signal that has been added in the adder, in the second gain controller, and
setting gain setting in the first gain controller based on gain setting in the second gain controller, in the gain setter.

19. The sound pickup method according to claim 15, further comprising the steps of:

transmitting gain setting information that has been set in the gain setter, to the first gain controller by a modulation signal through an analog audio line; and demodulating the modulation signal and setting a gain in the first gain controller.

20. The sound pickup method according to claim 15, further comprising the steps of:

selecting a sound signal of a highest level and outputting the sound signal that has been selected, in the adder.

* * * * *